（12）United States Patent
Liu

(10) Patent No.: US 12,276,887 B2
(45) Date of Patent: Apr. 15, 2025

(54) DRIVER CIRCUIT AND DISPLAY PANEL

(71) Applicant: HKC CORPORATION LIMITED, Shenzhen (CN)

(72) Inventor: Zhongnian Liu, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 590 days.

(21) Appl. No.: 17/420,134

(22) PCT Filed: Dec. 26, 2019

(86) PCT No.: PCT/CN2019/128751
§ 371 (c)(1),
(2) Date: Jun. 30, 2021

(87) PCT Pub. No.: WO2020/155970
PCT Pub. Date: Aug. 6, 2020

(65) Prior Publication Data
US 2022/0082878 A1    Mar. 17, 2022

(30) Foreign Application Priority Data

Jan. 30, 2019  (CN) .......................... 201910089137.1

(51) Int. Cl.
*H01L 27/12* (2006.01)
*G02F 1/133* (2006.01)
(Continued)

(52) U.S. Cl.
CPC ...... *G02F 1/13452* (2013.01); *G02F 1/13306* (2013.01); *H01L 27/124* (2013.01); *G02F 1/136286* (2013.01)

(58) Field of Classification Search
CPC ............. G02F 1/13452; G02F 1/13306; G02F 1/136286; G02F 1/1345; H01L 27/124; G09G 3/36; G09G 2320/0233
See application file for complete search history.

(56) References Cited

U.S. PATENT DOCUMENTS

| 2007/0086078 A1* | 4/2007 | Hagood | ............... G09G 3/3433 |
| | | | 359/298 |
| 2007/0279395 A1* | 12/2007 | Philipp | .................. G06F 3/0443 |
| | | | 345/173 |

(Continued)

FOREIGN PATENT DOCUMENTS

| CN | 103309107 A | * | 9/2013 | ......... G02F 1/13452 |
| CN | 109585500 A | * | 4/2019 | ........... G09G 3/3225 |

(Continued)

OTHER PUBLICATIONS

Yingying Nie, the International Searching Authority written comments, Mar. 2020, CN.
Yingying Nie. the International Searching Report, Mar. 2020. CN.

*Primary Examiner* — Mohammed Shamsuzzaman

(57) ABSTRACT

The present application discloses a driver circuit and a display panel. The driver circuit includes a driver circuit board (600); a gate driver chip (320) connected to the driver circuit board (600); a connecting line (330) connecting the driver circuit board (600) and the gate driver chip (320); a fanout cable (341) connected to the gate driver chip (320) and a gate line (500) of the display panel (100), forming a fanout region (340) with a fanout cable (341) connected to the gate driver chip (320); and an additional conductive film (350) disposed in the fanout region (340).

19 Claims, 3 Drawing Sheets

(51) Int. Cl.
    *G02F 1/1345*     (2006.01)
    *G02F 1/1362*     (2006.01)

(56) References Cited

U.S. PATENT DOCUMENTS

| | | | |
|---|---|---|---|
| 2012/0306826 A1 | 12/2012 | Tsuchi | |
| 2017/0047356 A1* | 2/2017 | Lee | G02F 1/136259 |
| 2018/0218191 A1* | 8/2018 | Berget | G06V 40/1306 |
| 2020/0225272 A1* | 7/2020 | Kim | H01L 22/14 |
| 2022/0406875 A1* | 12/2022 | Zhang | H10K 85/40 |

FOREIGN PATENT DOCUMENTS

| | | | | |
|---|---|---|---|---|
| CN | 109658891 A | | 4/2019 | |
| CN | 110297370 A | * | 10/2019 | G02F 1/13338 |
| CN | 111081750 A | * | 4/2020 | H01L 27/3244 |
| CN | 111323949 A | * | 6/2020 | G02F 1/13306 |
| CN | 116648662 A | * | 8/2023 | G06F 1/1639 |
| JP | 2007328346 A | | 12/2007 | |
| JP | 2008009429 A | * | 1/2008 | G02F 1/13452 |
| JP | 2019061242 A | * | 4/2019 | G06F 1/1626 |
| WO | WO-2014183327 A1 | * | 11/2014 | G02F 1/13452 |

\* cited by examiner

DRIVER CIRCUIT AND DISPLAY PANEL

CROSS REFERENCE OF RELATED APPLICATIONS

The present application claims priority to the Chinese Patent Application CN201910089137.1, filed with the National Intellectual Property Administration, PRC on Wednesday. Jan. 30, 2019 and entitled "DRIVER CIRCUIT, DISPLAY PANEL AND DISPLAY DEVICE", which is incorporated herein by reference in its entirety.

TECHNICAL FIELD

The present application relates to the technical field of display, particularly to a driver circuit and a display panel.

BACKGROUND

The statements herein merely provide background information related to the present application and do not necessarily constitute the conventional art.

With the advancement of science and technology, Liquid Crystal Displays (LCD) with the advantages, such as power saving, no radiation, small size, low power consumption, plane right angle, high resolution, stable image quality, etc. especially, various information products nowadays, such as mobile phones, notebook computers, digital cameras, liquid crystal screens and the like, are increasingly popularized, which greatly increases the demand of LCD. An LCD typically includes at least two driver chip connections that transmit gate driver signals. Two adjacent gate driver chips are also connected by a Wire On Array (WOA). Each gate driver chip is connected with a group of fanout cables on a substrate and connected respectively to each scanning line through the fanout cables.

As the WOA has a certain resistance value, the resistance value of the fanout cable connected with the latter gate driver chip is larger than that of the fanout cable connected with the former gate driver chip, so that the signal transmission between the adjacent gate driver chips is inconsistent, thus causing uneven brightness of the display panel as well as reducing display quality of the display panel.

SUMMARY

The application discloses a driver circuit which includes: a driver circuit board; a plurality of gate driver chips configured to connect to the driver circuit board; a connecting line configured to connect to the driver circuit board and the gate driver chips and transmit signals to the gate driver chips; a fanout cable configured to connect to the gate driver chip and a gate line of a display panel and forming a fanout region with a fanout cable connected to the same gate driver chip, where the fanout region is arranged in the transmission direction of the signals; and an additional conductive film arranged in the fanout region, where the additional conductive films formed in different fanout regions are defined by different areas, and the total area of the additional conductive film overlapping the fanout cable of each of the fanout regions decreases one by one in the transmission direction of the signals.

The application further discloses a driver circuit which includes: a driver circuit board; a plurality of gate driver chips configured to connect to the driver circuit board; a connecting line configured to connect to the driver circuit board and the gate driver chips and transmit signals to the gate driver chips; a fanout cable configured to connect to the gate driver chip and a gate line of a display panel and forming a fanout region with a fanout cable connected to the same gate driver chip, where the fanout region is arranged in the transmission direction of the signals; and an additional conductive films formed on a first one of the fanout regions to a second last one of the fanout regions in the transmission direction of the signals, where the additional conductive films formed in different fanout regions are defined by different areas, and the total area of the additional conductive film overlapping the fanout cable of each of the fanout regions decreases one by one in the transmission direction of the signals; the additional conductive film is correspondingly formed with each of the fanout cables, and the areas of overlap between the additional conductive film and each of the fanout cables in the same fanout region is the same; the additional conductive film is formed by combining an indium tin oxide conductive film with a metal conductive film.

The application further discloses a display panel which includes: a plurality of gate lines, and a driver circuit driving the gate lines, where the driver circuit includes a driver circuit board; a plurality of gate driver chips configured to connect to the driver circuit board; a connecting line configured to connect to the driver circuit board and the gate driver chips and transmit signals to the gate driver chips; a fanout cable configured to connect to the gate driver chip and a gate line of a display panel and forming a fanout region with a fanout cable connected to the same gate driver chip, where the fanout region is arranged in the transmission direction of the signals; and an additional conductive film arranged in the fanout region, where the additional conductive films formed in different fanout regions are defined by different areas, and the total area of the additional conductive film overlapping the fanout cable of each of the fanout regions decreases one by one in the transmission direction of the signals.

As fanout regions are connected through a connecting line formed with a certain resistance value, which leads to impacts on the transmission of signals. According to the time constant of signal delay $\tau=RC$, where R denotes resistance, and C denotes capacitor. An additional conductive film is added in the fanout region to form a compensation capacitor, so that the time constant of the signal delay of the previous fanout region is increased, therefore the time constants of the signal delay of the fanout regions are equal, and the signals of the fanout regions are synchronously output.

BRIEF DESCRIPTION OF DRAWINGS

The accompanying drawings, which are included to provide a further understanding of embodiments of the present application and constitute a part of the specification, illustrate embodiments of the application and, together with the text description, explain the principles of the application. Obviously, the drawings in the following description are merely some embodiments of the present application, and those skilled in the art can obtain other drawings according to the drawings without any inventive labor. In the drawings.

DETAILED DESCRIPTION OF EMBODIMENTS

It should be understood that the terminology, specific structural and functional details disclosed are merely exemplary for the purpose of describing specific embodiments. However, the present application may be embodied in many alternative forms and should not be construed as being limited to the embodiments set forth herein.

In the description of the present application, the terms "first" and "second" are only for the purpose of description and cannot be construed to indicate relative importance or imply an indication of the number of technical features indicated. Therefore, unless otherwise stated, a feature defined as "first" and "second" may explicitly or implicitly include one or more of the features; "multiple" means two or more. The term "include" and any variations thereof are intended to be inclusive in a non-closed manner, that is, the presence or addition of one or more other features, integers, steps, operations, units, components and/or combinations thereof may be possible.

In addition, the terms "center", "horizontally", "up", "down", "left", "right", "vertical", "horizontal", "top", "bottom", "inner", "outer" and the like for indicating an orientation or positional relationship are based on the description of the orientation or relative positional relationship shown in the accompanying drawings, and are only simplified description facilitating description of the application, and are not intended to indicate that the device or element referred to must have a particular orientation, be configured and operated in a particular orientation, and therefore cannot be construed as limiting the present application.

In addition, unless expressly specified and defined otherwise, the terms "mount". "attach" and "connect" are to be understood broadly, for example, it can be a fixed connection, a detachable connection, or an integral connection; it can be an either mechanical connection or an electrical connection; it can be a direct connection or an indirect connection through an intermediate medium, or an internal connection between two elements. For those skilled in the art, the specific meaning of the above terms in this application can be understood according to the specific circumstances.

Figure 1:
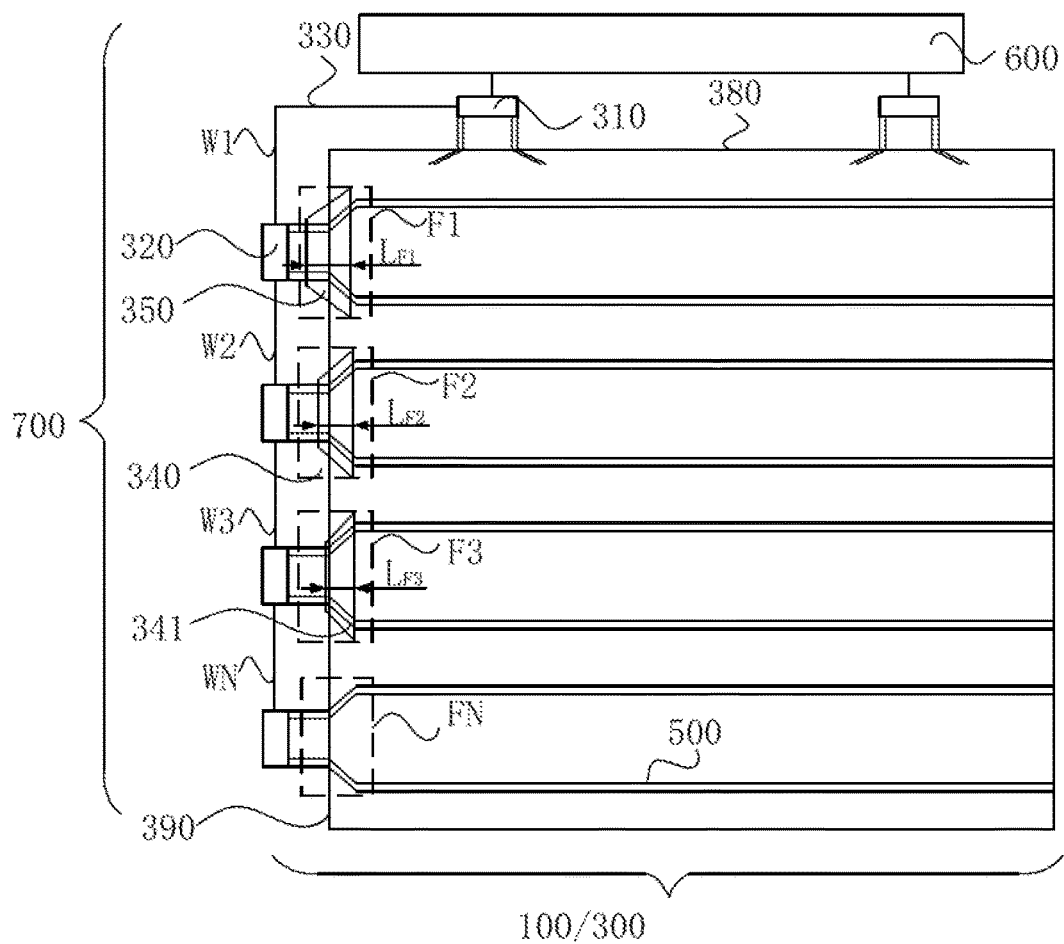
FIG. 1 is a schematic diagram of the structure of an array substrate according to an embodiment of the present application.

As shown in FIG. 1, a signal is transmitted from the source driver chip 310, enters the fanout cable 341 through the connecting line 330, and then enters the Active Area (AA) within the display panel 100.

The present application will now be further described by reference to the accompanying drawings and optional embodiments.

As shown in FIG. 1, as an embodiment of the present application, a display panel 100 is disclosed, which includes: a substrate, a plurality of groups of gate lines 500, and a driver circuit 700 driving the gate lines 500, where the driver circuit 700 includes a driver circuit board 600; a plurality of source driver chips 310 disposed on the first side 380 of the substrate and connected to the driver circuit board 600; a plurality of gate driver chips 320 disposed on the second side 390 of the substrate and connected to the source driver chips 310 or the driver circuit board 600; a connecting line 330 connecting the driver circuit board 600 and the gate driver chip 320 and configured to transmit signals to the gate driver chip 320; a fanout cable 341 connected to the gate driver chip 320 and the gate lines 500 of the display panel 100 and forming a fanout region 340 with a fanout cable 341 connected to the same gate driver chip 320, and the fanout region 340 is arranged in the transmission direction of the signals; and an additional conductive film 350 formed in the fanout region 340, where the additional conductive films 350 formed in different fanout regions 340 are defined by different areas, and the total area of the additional conductive film 350 overlapping the fanout cable 341 of each of the fanout regions 340 decreases one by one in the transmission direction of the signals, the additional conductive film 350 formed on a first one of the fanout regions 340 to a second last one of the fanout regions 340, with no additional conductive films formed in the last fanout region, where a start boundary and an end boundary of the additional conductive film 350 formed in each of the fanout regions 340 are parallel, and are parallel with the second edge 390 of the substrate; for a display panel 100 with N fanout regions 340, the time constant of the signal delay $\tau 1 = \tau 2 = \tau 3 \ldots = \tau N$, that is: $(R_{W1}+R_{F1})(C_{W1}+C_{F1})=(R_{W1}+R_{W2}+R_{F2})(C_{W1}+C_{W2}+C_{F2})=(R_{W1}+R_{W2}+R_{W3}+R_{F3})(C_{W1}+C_{W2}+C_{W3}+C_{F3})= \ldots =(R_{W1}+R_{W2}+R_{W3}+ \ldots R_{WN}+R_{FN})(C_{W1}+C_{W2}+C_{W3}+ \ldots +C_{WN}+C_{FN})$.

In the above calculation formula, all R values can be obtained by calculation, each $C_W$ value is obtained by calculation, and the only variable is $C_F$, so that the time constant T of signal delay of each fanout region 340 is made equal by controlling the $C_F$ value of each fanout region 340 through adding an additional conductive film 350 to form a capacitor with the fanout cable 341, that is, the area of the additional conductive film 350 overlapping the fanout cable 341 is controlled to control the $C_F$ value, so that signals of each fanout region 340 are synchronously output, pixels are charged by the gate lines 500 uniformly, and the picture is displayed more uniformly.

The substrate is an array substrate 300, the first edge 380 and the second edge 390 are two mutually perpendicular adjacent edges of the array substrate 300, and the additional conductive film 350 is in a suspended state and is not connected with other components.

It is also feasible to correspondingly formed the additional conductive film in all the fanout regions.

Figure 2:
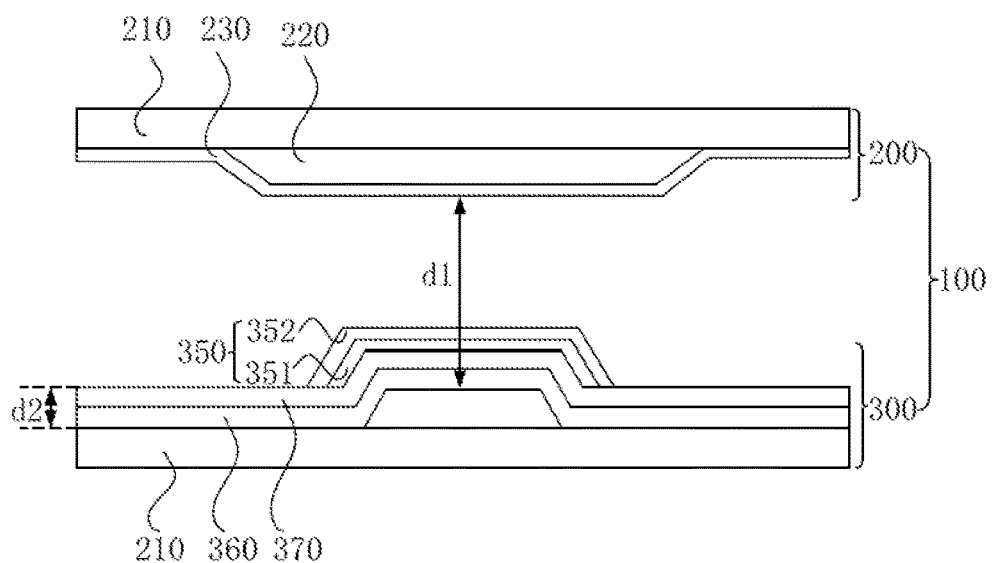
FIG. 2 is a schematic diagram of a cross-sectional structure of a fanout region according to an embodiment of the present application.

As shown in FIGS. 1 and 2, as another embodiment of the present application, a display panel 100 is disclosed, including a color filter substrate 200 and an array substrate 300, where the color filter substrate 200 includes a glass substrate 210, a color resist 220 and a first conductive film 230, where the color resist 220 is disposed on the glass substrate 210, and the first conductive film 230 is disposed on the color resist 220; the array substrate 300 includes a source driver chip 310, a gate driver chip 320, a connecting line 330, a fanout cable 341, an additional conductive film 350, an insulating layer 360, and a passivation layer 370; the source driver chip 310 configured to connect to the gate driver chip 320 through the connecting line 330, the gate driver chips 320 on the same side are also connected by the connecting line 330, forming a fanout region 340 with a fanout cable 341 connected to the same gate driver chip 320, where the fanout region 340 is arranged in the transmission direction of the signals, each fanout region 340 is correspondingly formed with an additional conductive film 350, and the additional conductive films 350 formed in different fanout regions 340 are defined by different areas, where the total area of the additional conductive film 350 overlapping the fanout cable 341 of each fanout region 340 decreases one by one in the transmission direction of the signals, and compensation capacitors with different magnitudes are increased by adding additional conductive films 350 with different areas.

The calculation formula of the time constant T of the signal delay of the fanout cable 341 is: τ=RC, where R denotes resistance, C denotes capacitance, and a calculation formula of the capacitance C is $$C = \frac{\varepsilon S}{4\pi kd} C,$$

where ε denotes a dielectric permittivity. S denotes a facing area of two polar plates, π denotes the circular constant, k denotes electrostatic force constant, and d denotes a vertical distance between the two polar plates. S in this scheme denotes a facing area of the additional conductive film 350 and the fanout cable 341, different compensation capacitances C are obtained by controlling the facing area S of the additional conductive film 350 and the fanout line 341, specifically, the facing areas S of the additional conductive film 350 and the fanout line 341 decrease one by one from the first fanout region 340, and the compensation capacitances C also decrease one by one from the first fanout region 340.

During the signal transmission between the gate driver chips 320, the fanout cable 341 may generate a signal delay due to the resistance of the connecting line 330, and the time constant τ of the signal delay is influenced by the resistance R and the capacitance C according to the calculation formula of the time constant r. The signal of each fanout region 340 is delayed due to the resistance of the connecting line 330 between the gate driver chips 320, so an additional conductive film 350 is formed in the fanout region 340 to form a capacitor C with the fanout cable 341; as the lengths of the connecting lines 330 configured to connect to the fanout regions 340 are different, the magnitudes of the resistances R which generate influences are also different. From the calculation formula of the capacitor C, the magnitudes of the capacitors are controlled by controlling the facing areas S of the additional conductive films 350 and the fan-out lines 341, and the additional conductive films 350 with different areas are formed in the fanout regions 340, so that the time constants r of the fanout regions 340 are consistent, signals are output simultaneously, the pixels are charged uniformly by the gate lines 500, and the picture is displayed more uniformly.

Specifically, for a certain fanout cable 341 of the first fanout region 340, the time constant of the signal delay is $\tau 1=(R_{W1}+R_{F1})(C_{W1}+C_{F1})$, where the connecting lines 330 are arranged in the transmission direction of the signals, Rw1 and Cw1 are respectively the resistance and capacitance of the first connecting line 330, and $R_{F1}$ and $C_{F1}$ are respectively the resistance and capacitance of the fanout cable 341 in the first fanout region 340; for the resistance of the first connecting line 330 $R_{w1}=Rs \times L_{w1}/W_{w1}$, where $L_{W1}$, $W_{W1}$ are respectively the length and width of the first connecting line 330; similarly, the resistance of the first fanout region 340 $R_{F1}=Rs \times L_{F1}/W_{F1}$ can be obtained. For the connecting line 330 not covered by the additional conductive film 350, the capacitance Cw1 thereof is formed by the connecting line 330 and the first conductive film 230 of the color filter substrate 200, and the capacitance is $C_{w1}=\varepsilon_0 \cdot \varepsilon_L \cdot S_{w1}/d_1$, where $\varepsilon_0$ denotes the absolute dielectric constant, $\varepsilon_L$ denotes the relative dielectric constant of the liquid crystal, SW1 denotes the area of the connecting line 330, d1 denotes the thickness of the liquid crystal cell, and is between 3-4 μm. For the fanout cable 341, assuming that the length of the fanout cable 341 covered by the additional conductive film 350 is $L_{F11}$, and the length of the fanout cable 341 not covered by the additional conductive film 350 is $L_{F12}$, $L_{F11}+L_{F12}=L_{F1}$, the capacitance of the fanout cable 341 covered by the additional conductive film 350 includes two parts, namely, the capacitance between the fanout cable 341 and the additional conductive film 350, and the capacitance between the fanout cable 341 and the first conductive film 230 on the color filter substrate 200 side: $C_{F11}=\varepsilon_0 \cdot \varepsilon_P \cdot S_{F11}/d_2+\varepsilon_0 \cdot \varepsilon_L \cdot S_{F11}/d_1$, $S_{F11}=W_{F1} \cdot LF_{11}$ where $\varepsilon_P$ denotes the dielectric constant of insulating layer 360 and passivation layer 370 and $d_2$ denotes the sum of the thicknesses of the insulating layer 360 and the passivation layer 370. Since $\varepsilon_P \approx \varepsilon_L$ and $d_1 \geq d_2$, the second term in the calculation formula for the capacitance $C_{F11}$ is negligible in the rough calculation.

For the fanout cable 341 not covered by the additional conductive film 350, the capacitance thereof only includes the capacitance of the fanout cable 341 and the first conductive film 230 on the color filter substrate 200 side: $C_{F12}=\varepsilon_0 \cdot \varepsilon_L \cdot S_{F12}/d_1$ where $S_{F12}=W_{F1} \cdot L_{F12}$, $W_{F1}$ denotes the width of fanout region 340. The capacitance of the fanout region 340 thus includes the sum of the capacitances of the wires covered by the additional conductive film 350 and not covered by the additional conductive film 350: $C_{F1}=C_{F11}+C_{F12}$. Similarly, the time constant of the signal delay of a certain fanout cable 341 in the second fanout region 340 can be calculated, and in the design of one display panel 100, the fanout cables 341 corresponding to different gate driver chips 320 have the same design, so $R_{F1}=R_{F2}$, the difference is that the second fanout region 340 introduces a calculating part influenced by the second connecting line 330, and the time constant of the signal delay of the second fanout region 340 is: $\tau_2=(R_{W1}+R_{W2}+R_{F2})(C_{W1}+C_{W2}+C_{F2})$. The time constants of the signal delays between fanout regions are the same, so that $\tau_1=\tau_2$, namely $(R_{W1}+R_{F1})(C_{W1}+C_{F1})=(R_{W1}+R_{W2}+R_{F2})(C_{W1}+C_{W2}+C_{F2})$, in all the parameters above, all the R values can be calculated with the existing parameters, and the C value of the connecting line 330 can also be calculated. The only variable is the C value caused by the different lengths of the fanout cables 341 of the adjacent two fanout regions 340 covered by the additional conductive film 350, and the relationship of the lengths of the adjacent fanout regions 340 covered by the additional conductive film 350 can be obtained by the above formula, thereby accurately controlling the signal delays of the adjacent COF wires. It can be further obtained from the above formula that, $R_{W1}+R_{F1}<R_{W1}+R_{W2}+R_{F2}$ if the formula is satisfied, $C_{W1}+C_{F1}>C_{W1}+C_{W2}+C_{F2}$, that is $C_{F1}>C_{F2}$, so the area of the additional conductive film 350 covering the first fanout region 340 is larger than that of the additional conductive film 350 of the second fanout region 340. In order to further improve the display effect, the time constant of the signal delay of each fanout cable in each fanout region is the same.

For the display panel 100 formed with N of the fanout regions 340, the time constant of the signal delay $\tau_1=\tau_2=\tau_3 \ldots =\tau_N$, i.e. $(R_{W1}+R_{F1})(C_{W1}+C_{F1})=(R_{W1}+R_{W2}+R_{F2})(C_{W1}+C_{W2}+C_{F2})=(R_{W1}+R_{W2}+R_{W3}+R_{F3})(C_{W1}+C_{W2}+C_{W3}+C_{F3})= \ldots =(R_{W1}+R_{W2}+R_{W3}+ \ldots +R_{WN}+R_{FN})(C_{W1}+$ $C_{W2}+C_{W3}+\ldots+C_{WN}+C_{FN}$); it can be concluded that $R_{W1}+R_{F1}<R_{W1}+R_{W2}+R_{F2}<R_{W1}+R_{W2}+R_{W3}+R_{F2}<R_{W1}+R_{W2}+R_{W3}+\ldots+R_{WN}+R_{F2}$, therefore $C_{W1}+C_{F1}>C_{W1}+C_{W2}+C_{F2}>C_{W1}+C_{W2}+C_{W3}+C_{F2}>C_{W1}+C_{W2}+C_{W3}+\ldots+C_{WN}+C_{F2}$, namely, $C_{F1}>C_{F2}>C_{F3}>\ldots>C_{FN}$.

The coverage area of the additional conductive film 350 on the first fanout region 340 is set to be the largest, and then the areas of the additional conductive films decrease one by one in sequence, so that the compensation capacitance values of the fanout regions 340 decrease one by one in sequence, the time constants of the signal delays of the fanout regions 340 are the same, therefore signals are synchronously output, pixels are charged by the gate lines 500 uniformly, and the picture is displayed more uniformly.

In one embodiment, the additional conductive film 350 is formed on the first fanout region 340 to the second last fanout region 340 in the transmission direction of the signal, and the last fanout region 340 is not formed with the additional conductive film 350. The time constant of the signal delay of the previous fanout region 340 is calculated by taking the time constant of the signal delay of the last fanout region 340 as a reference, so that the time constant of the signal delay from the first fanout region 340 second last fanout region 340 is equal to that of the signal delay of the last fanout region 340, and thus, the last fanout region 340 does not need to be formed with the additional conductive film 350, saving the procedure and the material.

Figure 3:
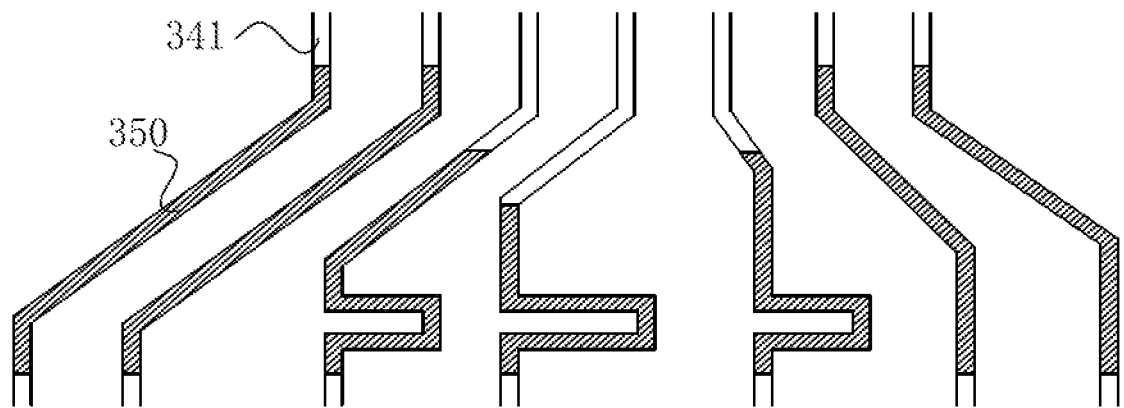
FIG. 3 is a schematic diagram of a fanout region with an additional conductive film provided therein according to an embodiment of the present application.

As shown in FIGS. 2 and 3, in an embodiment, the array substrate 300 includes an insulating layer 360 and a passivation layer 370, where the insulating layer 360 is disposed on the fanout cables 341, the passivation layer 370 is disposed on the insulating layer 360, the additional conductive film 350 is formed on the passivation layer 370 corresponding to each fanout cable 341, and the areas of the additional conductive film 350 overlapping each fanout line 341 formed in the same fanout region 340 are the same. The areas of the additional conductive film 350 overlapping each fanout cable 341 in the same fanout region 340 are the same, so that the compensation capacitance added on each fanout cable 341 of the same fanout region 340 is the same, and the time constant of the signal delay of each fanout cable 341 is also the same, so that the signal of each fanout cable 341 of the same fanout region 340 is synchronously output, pixels are charged by the gate lines 500 uniformly, and the picture is displayed more uniformly.

Specifically, the additional conductive film 350 is formed by combining an indium tin oxide conductive film 351 and a metal conductive film 352, and the positions of the two films are not limited.

The additional conductive film 350 may also be formed at the bottom or other positions of the fanout region 340; the additional conductive film 350 may be an indium tin oxide conductive film 351 or a metal conductive film 352.

Figure 4:
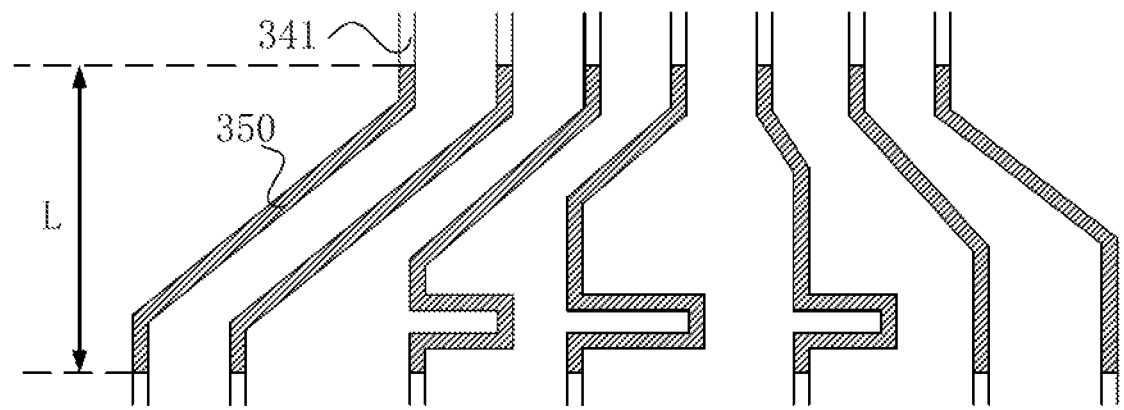
FIG. 4 is a schematic diagram of a fanout region with an additional conductive film provided therein according to another embodiment of the present application.

As shown in FIG. 4, in an embodiment, the start boundary and the end boundary of the additional conductive film 350 formed in each fanout region 340 are parallel and parallel to the second edge 390 of the array substrate 300, and the vertical distance between the start boundary and the end boundary is L. In the manufacturing process, the effective area of the additional conductive film 350 is increased or decreased by controlling the value of the distance L, so that the production is facilitated.

Figure 5:
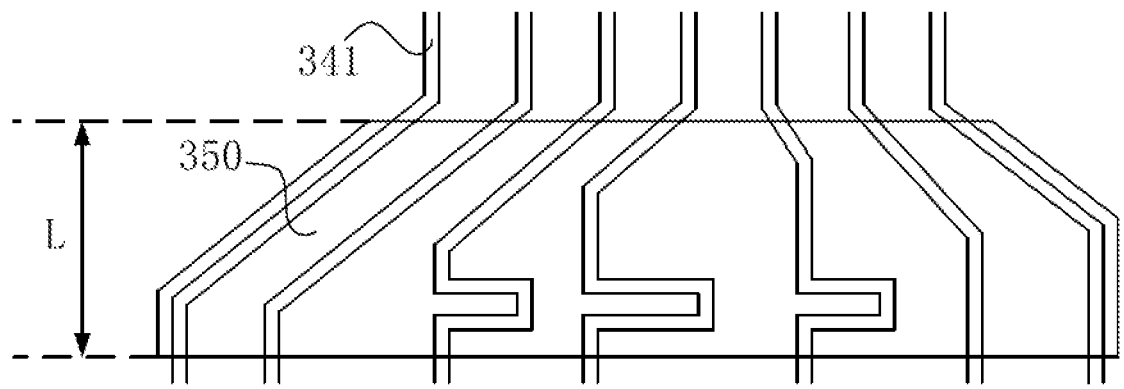
FIG. 5 is a schematic diagram of a fanout region with an additional conductive film provided therein according to another embodiment of the present application.

As shown in FIG. 5, in an embodiment, a fanout region 340 is formed with a whole piece of an additional conductive film 350 having a trapezoidal shape. Covering with the whole piece of the additional conductive film 350 saves partial procedure for processing the additional conductive film 350, and setting the shape of the additional conductive film 350 to be trapezoidal reduces the invalid area of the additional conductive film 350 and saves the material. The additional conductive film 350 may have other shapes, such as a triangle, a rectangle, an oval, and the like.

Figure 6:
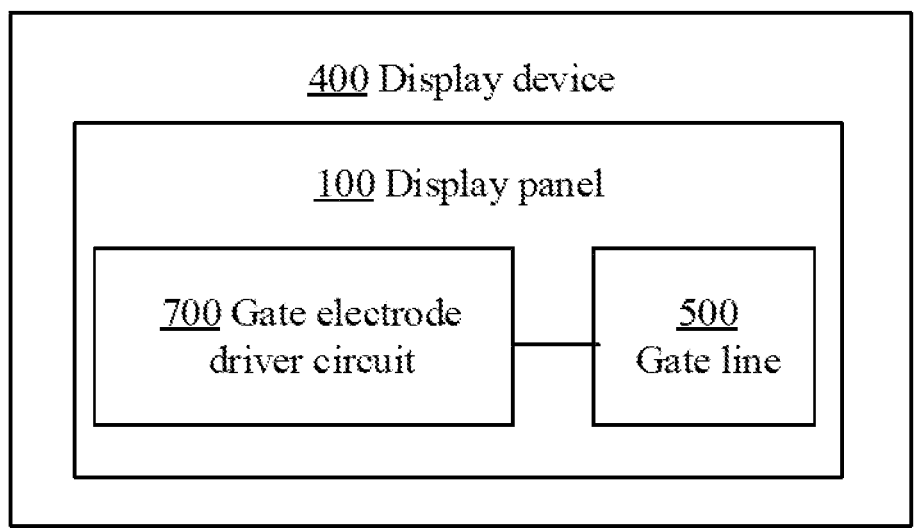
FIG. 6 is a schematic diagram of a display device according to an embodiment of the present application.

As shown in FIG. 6, as another embodiment of the present application, a display device 400 is disclosed, including the display panel 100 described above, the display panel 100 includes gate lines 500 and a driver circuit 700.

The technical scheme of the present application can be widely used in various display panels, such as Twisted Nematic (TN) display panels, In-Plane Switching (IPS) display panels, Vertical Alignment (VA) display panels and Multi-Domain Vertical Alignment (MVA) display panels, and, of course, other types of display panels, such as Organic Light-Emitting Diode (OLED) display panels.

The above content is a further detailed description of the present application in conjunction with specific, optional embodiments, and it is not to be construed that specific embodiments of the present application are limited to these descriptions. For those of ordinary skill in the art to which this application belongs, a number of simple derivations or substitutions may be made without departing from the spirit of this application, all of which shall be deemed to fall within the scope of this application.

What is claimed is:

1. A driver circuit, comprising:
   a driver circuit board;
   a plurality of gate driver chips connected to the driver circuit board;
   a connecting line connecting the driver circuit board to the plurality of gate driver chips and configured to transmit signals to the plurality of gate driver chips;
   a plurality of fanout cables, each of which being connect the respective gate driver chip to a respective gate line of a display panel, wherein the fanout cables that are connected to each gate driver chip form a fanout region thus resulting in a plurality of fanout regions disposed in one-to-one correspondence with the plurality of gate driver chips, wherein the plurality of fanout regions are arranged along a transmission direction of the signals, wherein the signals are transmitted from a previous gate driver chip to a next gate driver chip; and
   a plurality of additional conductive films arranged in one-to-one correspondence in the plurality of fanout regions, wherein the plurality of additional conductive films disposed in different fanout regions have different areas, and wherein a total overlapping area between a respective additional conductive film and all the fanout cables of each of the plurality of fanout regions decreases from one fanout region to next fanout region in a single direction along the transmission direction of the signals and wherein the total overlapping area is covered by a shape the respective additional conductive film.

2. The driver circuit according to claim 1, wherein a start boundary and an end boundary of the respective additional conductive film formed in each of the fanout regions are parallel to each other.

3. The driver circuit according to claim 1, wherein there is disposed said additional conductive film on each of a first one of the plurality of fanout regions to a second last one of the plurality of fanout regions in the transmission direction of the signals.

4. The driver circuit according to claim 1, wherein there is formed said additional conductive film on each of all the plurality of fanout regions.

5. The driver circuit according to claim 1, wherein there is disposed said additional conductive film corresponding to each of the plurality of fanout cables, and wherein in each same fanout region an overlapping area between each additional conductive film and the respective fanout cable is equal.

6. The driver circuit according to claim 2, wherein one of the fanout regions is correspondingly formed with a whole piece of the additional conductive film.

7. The driver circuit according to claim 6, wherein the shape of the additional conductive film is trapezoidal.

8. The driver circuit according to claim 6, wherein the shape of the additional conductive film is triangular.

9. The driver circuit according to claim 6, wherein the shape of the additional conductive film is rectangular.

10. The driver circuit according to claim 6, wherein the shape of the additional conductive film is oval.

11. The driver circuit according to claim 1, wherein a time constant of a signal delay between every two of the plurality of fanout regions is equal.

12. The driver circuit according to claim 11, wherein a time constant of a signal delay of each of the plurality of fanout regions is:

$$\tau=(R_W+R_F)(C_W+C_F);$$

wherein $R_W$ and $C_W$ are resistance and capacitance of the connecting line connected to one of the fanout regions, and $R_F$ and $C_F$ are resistance and capacitance of one of the fanout regions.

13. The driver circuit according to claim 1, wherein a time constant of a signal delay of each of the plurality of fanout cables in each of the plurality of fanout regions is equal.

14. The driver circuit according to claim 1, wherein each of the plurality of additional conductive films is an indium tin oxide conductive film.

15. The driver circuit according to claim 1, wherein each of the plurality of additional conductive films is a metal conductive film.

16. The driver circuit according to claim 1, wherein each of the plurality of additional conductive films is formed by combining an indium tin oxide conductive film with a metal conductive film.

17. A driver circuit, comprising:
a driver circuit board;
a plurality of gate driver chips connected to the driver circuit board;
a connecting line connecting the driver circuit board to the plurality of gate driver chips and configured to transmit signals to the plurality of gate driver chips;
a plurality of fanout cables, each of which being connect the respective gate driver chip to a respective gate line of a display panel, wherein the fanout cables that are connected to each gate driver chip form a fanout region thus resulting in a plurality of fanout regions disposed in one-to-one correspondence with the plurality of gate driver chips, wherein the plurality of fanout regions are arranged along a transmission direction of the signals, and wherein the signals are transmitted from a previous gate driver chip to a next gate driver chip; and
a plurality of additional conductive films disposed on a first one of the plurality of fanout regions to a second last one of the plurality of fanout regions in the transmission direction of the signals, wherein the plurality of additional conductive films disposed in different fanout regions have different areas, and wherein a total overlapping area between the respective additional conductive film overlapping all the fanout cables of each of the plurality of fanout regions decreases from one fanout region to next fanout region in a single direction along the transmission direction of the signals and wherein the total overlapping area is covered by a shape the respective additional conductive film;
wherein the additional conductive film is disposed corresponding to each of the plurality of fanout cables, and wherein in each same fanout region an overlapping area between each additional conductive film and the respective fanout cable is equal; wherein the additional conductive film is formed by combining an indium tin oxide conductive film with a metal conductive film.

18. A display panel, comprising a plurality of gate lines, and a driver circuit configured to drive the plurality of gate lines;
wherein the driver circuit comprises:
a driver circuit board;
a plurality of gate driver chips connected to the driver circuit board;
a connecting line connecting the driver circuit board to the plurality of gate driver chips and configured to transmit signals to the plurality of gate driver chips;
a plurality of fanout cables, each of which being connect the respective gate driver chip to a respective gate line of a display panel, wherein the fanout cables that are connected to each gate driver chip form a fanout region thus resulting in a plurality of fanout regions disposed in one-to-one correspondence with the plurality of gate driver chips, wherein the plurality of fanout regions are arranged along a transmission direction of the signals, wherein the signals are transmitted from a previous gate driver chip to a next gate driver chip; and
a plurality of additional conductive films arranged in one-to-one correspondence in the plurality of fanout regions, wherein the plurality of additional conductive films disposed in different fanout regions have different areas, and wherein a total overlapping area between the respective additional conductive film and all the fanout cables of each of the plurality of fanout regions decreases from one fanout region to next fanout region in a single direction along the transmission direction of the signals and wherein the total overlapping area is covered by a shape the respective additional conductive film.

19. The display panel according to claim 18, wherein there is formed said additional conductive films formed on each of a first one of the plurality of fanout regions to a second last one of the plurality of fanout regions in the transmission direction of the signals; wherein there is formed said additional conductive film corresponding to each of the plurality of fanout cables, and wherein in each same fanout region an overlapping area between each additional conductive film and the respective fanout cable is equal; wherein a time constant of a signal delay between every two of the plurality of fanout regions is equal.

* * * * *